United States Patent
Ramanan et al.

(10) Patent No.: US 11,742,012 B2
(45) Date of Patent: Aug. 29, 2023

(54) MEMORY READ CIRCUITRY WITH A FLIPPED VOLTAGE FOLLOWER

(71) Applicant: NXP USA, INC., Austin, TX (US)

(72) Inventors: Karthik Ramanan, Austin, TX (US); Jon Scott Choy, Austin, TX (US); Padmaraj Sanjeevarao, Austin, TX (US)

(73) Assignee: NXP USA, INC., Austin, TX (US)

(*) Notice: Subject to any disclaimer, the term of this patent is extended or adjusted under 35 U.S.C. 154(b) by 133 days.

(21) Appl. No.: 17/333,109

(22) Filed: May 28, 2021

(65) Prior Publication Data

US 2022/0383925 A1 Dec. 1, 2022

(51) Int. Cl.
  *G11C 11/16* (2006.01)
  *G11C 7/06* (2006.01)
  *G11C 7/08* (2006.01)
  *G11C 11/4074* (2006.01)
  *G11C 13/00* (2006.01)

(52) U.S. Cl.
  CPC .......... *G11C 11/1673* (2013.01); *G11C 7/062* (2013.01); *G11C 7/08* (2013.01); *G11C 11/4074* (2013.01); *G11C 2013/0042* (2013.01); *G11C 2013/0045* (2013.01); *G11C 2013/0054* (2013.01)

(58) Field of Classification Search
  None
  See application file for complete search history.

(56) References Cited

U.S. PATENT DOCUMENTS

| | | | |
|---|---|---|---|
| 4,388,705 A * | 6/1983 | Sheppard | G11C 17/126 365/230.01 |
| 6,384,664 B1 | 5/2002 | Hellums et al. | |
| 6,512,689 B1 * | 1/2003 | Naji | G11C 7/14 365/158 |
| 6,995,601 B2 | 2/2006 | Huang et al. | |
| 8,923,041 B2 | 12/2014 | Andre et al. | |
| 9,196,342 B2 | 11/2015 | Alam et al. | |
| 9,601,165 B1 | 3/2017 | Dray et al. | |
| 9,847,116 B2 | 12/2017 | Gogl et al. | |
| 2004/0062117 A1 | 4/2004 | Perner et al. | |
| 2005/0151578 A1 | 7/2005 | Huang et al. | |
| 2008/0175062 A1 * | 7/2008 | Tran | G11C 16/26 365/185.21 |
| 2009/0225586 A1 * | 9/2009 | Ueda | G11C 29/12 365/158 |
| 2012/0155146 A1 * | 6/2012 | Ueda | G11C 11/1673 365/148 |
| 2021/0012821 A1 | 1/2021 | Ramanan et al. | |

(Continued)

OTHER PUBLICATIONS

Carvajal, R., "The Flipped Voltage Follower: A Useful Cell for Low-Voltage Low-Power Circuit Design", IEEE Transactions on Circuits and Systems 1: Regular Papers, vol. 52, No. 7, Jul. 2005.

(Continued)

*Primary Examiner* — J. H. Hur

(57) ABSTRACT

A memory includes read circuitry for reading values stored in memory cells. The read circuitry includes flipped voltage followers for providing bias voltages to nodes of current paths coupled to sense amplifiers during memory read operations.

21 Claims, 5 Drawing Sheets

(56) References Cited

U.S. PATENT DOCUMENTS

2022/0101902 A1* 3/2022 Ramanan ............ G11C 11/1673
2022/0101903 A1* 3/2022 Choy ................... G11C 13/004

OTHER PUBLICATIONS

Chen, C., "Flipped Voltage Follower Ddesign Technique for Maximised Linear Operation", Scientific Research, doi:10.4236/eng.2010.28085 Published Online Aug. 2010 (http://www.SciRP.org/journal/eng), Aug. 2010.

Na, T., "Reference-Scheme Study and Novel Reference Scheme for Deep Submicrometer STT-RAM", IEEE Transactions on Circuits and Systems—I: Regular Papers, vol. 61, No. 12, Dec. 2014.

\* cited by examiner

US 11,742,012 B2

MEMORY READ CIRCUITRY WITH A FLIPPED VOLTAGE FOLLOWER

BACKGROUND OF THE INVENTION

Field of the Invention

This invention relates to memories.

Background

Memories are utilized for storing data in electronic systems. One type of memory is a resistive memory, in which each memory cell of a resistive memory includes a resistive storage element which is in either at a high resistive state (HRS) or a low resistive state (LRS), depending on the logic value being stored in the memory cell. Read circuitry is utilized to read the logic values stored in memory cells of a memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes read circuitry for reading values stored in memory cells. The read circuitry includes flipped voltage followers for providing bias voltages to nodes of current paths coupled to sense amplifiers during memory read operations. The providing of bias voltages may allow for emulation of reference cells without implementing large reference resistors for those reference cells in some embodiments. Also, the use of flipped source follows in some embodiments, may allow for fast settling times in providing the bias voltages even in light of small sensing currents.

Figure 1:
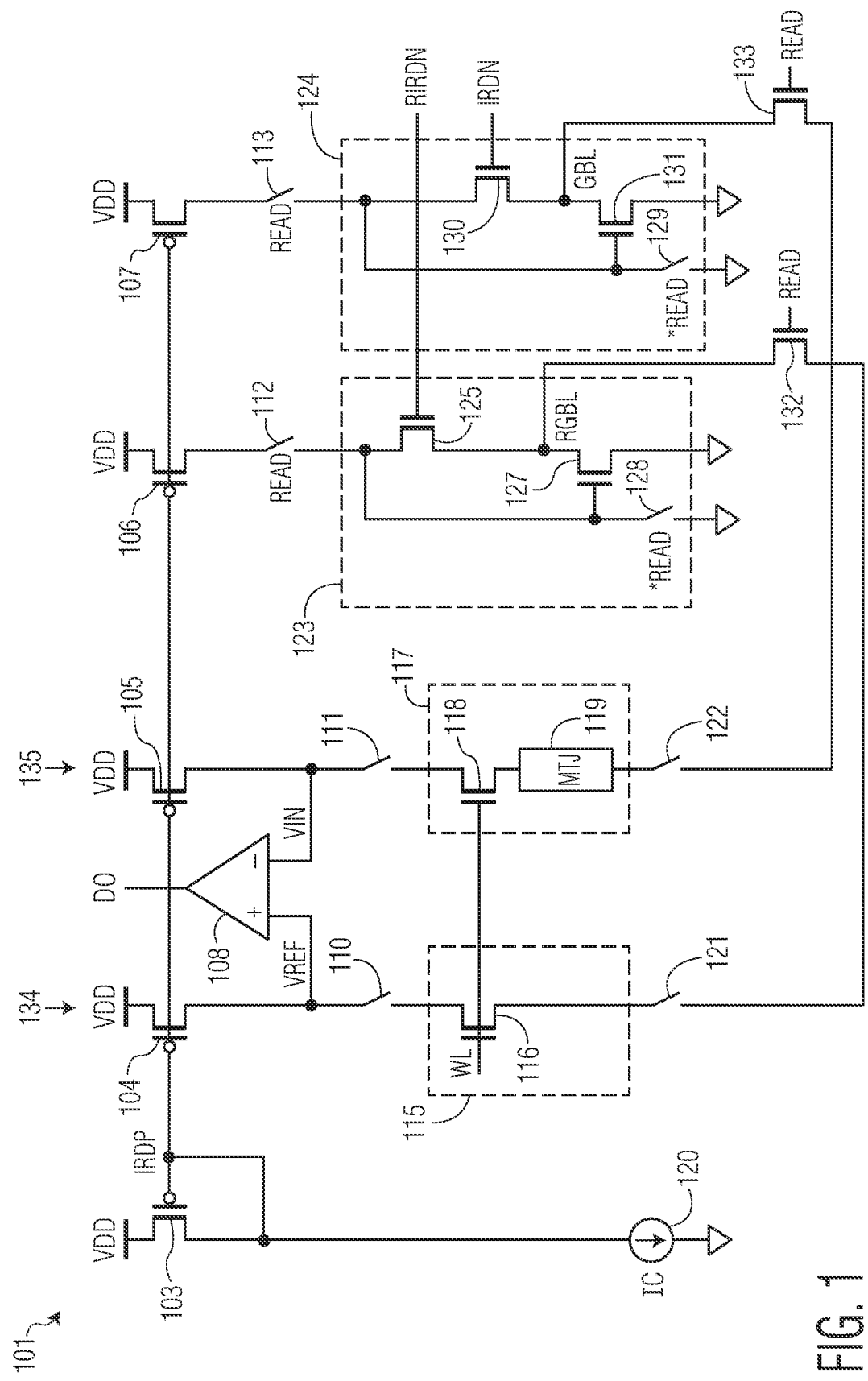
FIG. 1 is a circuit diagram of portions of read circuitry of a memory according to one embodiment of the present invention.

FIG. 1 is a circuit diagram of read circuitry 101 of a memory for reading a value stored in a memory cell 117. Memory cell 117 is part of an array (e.g. 212) of memory cells. In the embodiment shown, memory cell 117 is an MRAM memory cell with a magneto tunnel junction (MTJ) 119 whose resistance state is programed to store a logical value. Cell 117 also includes a select transistor 118 that is activated by a word line (WL) during a memory operation for accessing cell 117. Switches 111 and 122 are closed to couple cell 117 to the VIN input of sense amplifier 108 during a memory read operation.

In the embodiment shown, reference cell 115 include just a select transistor 116 that is activated by the WL signal. In one embodiment, reference cell 115 is located on the same row of the array as cell 117, but may be located in other portions of the memory in other embodiments. Switches 110 and 121 are closed to couple reference cell 115 to the VREF input of sense amplifier 108 during a memory read operation.

In the embodiment shown, sense amplifier 108 is implemented with a voltage comparator. During a memory read operation, sense amplifier 108 compares the voltages of its inputs (VREF, VIN) to provide an indication of whether a logical "1" or "0" is stored in memory cell 117. However, other types of sense amplifiers may be used in other embodiments.

Circuitry 101 includes a flipped voltage follower 123 for providing a bias voltage at node RGBL of a reference current path 134 that is coupled to the VREF input of sense amplifier 108. Flipped voltage follower 123 includes an NFET 125 that receives a bias voltage RIRDN to set a desired voltage at node RGBL during a memory read operation. Flipped voltage follower 123 includes transistor 127 that includes a drain connected to node RGBL and a gate biased by the drain of transistor 125. Transistor 127 provides a negative feedback to maintain the voltage at node RGBL at a desired value. A flipped voltage follower is a source follower in which a current source is located on the drain side of the source follower transistor (125, 130) and in which a feedback path from a node coupled on the drain side of the source follower transistor controls a second transistor (127, 131) coupled on the source side of the source follower transistor for voltage stabilization of a source side node of the source follower transistor. With a flipped voltage follower, the source node voltage of the source follower transistor is kept relatively constant independent of load current. A flipped voltage follower may have other configurations in other embodiments such as having a folded flipped voltage follower configuration.

Circuitry 101 includes a flipped voltage follower 124 for providing a bias voltage at node GBL of a cell current path 135 that is coupled to the VIN input of sense amplifier 108. Flipped voltage follower 124 includes an NFET 130 that receives a bias voltage IRDN to set a desired voltage at node GBL during a read operation. Flipped voltage follower 124 includes transistor 131 that includes a drain connected to node GBL and a gate biased by the drain of transistor 130.

Circuitry 101 includes current source 120 that produces current IC and PFETs 103-107 that implement a current mirror that are biased by voltage IRDP to produce current IC in the various current paths including current paths 134 and 135.

During a memory read operation for reading the contents of cell 117, switches 110, 111, 121 and 122 are closed and transistors 132 and 133 are made conductive so as to provide a current path from node RGBL through cell 115 to VREF and to provide a current path from node GBL through cell 117 to VIN. Word line WL is asserted to make conductive transistors 116 and 118. The gates of transistor 132 and 133 are biased by the READ signal provided by a memory controller (e.g. controller 220 of FIG. 2) that is asserted during a memory read operation to make those transistors conductive. Also, during a memory read operation, switches 128 and 129 are opened by the *READ signal being in a non-asserted state to allow the gates transistors 127 and 131 to be biased by the drains of transistors 125 and 130 respectively. When a read operation is not being performed, the *READ signal is asserted to close switches 128 and 129 for grounding the gates of transistors 127 and 131, respectively, such that no current flows through those transistors. Switches 112 and 113 are closed during a read operation and are opened when no read operations are being performed.

During a memory read operation, current flowing through memory cell 117 produces a voltage drop across the cell that is dependent on whether MTJ 119 is in a high resistive state or a low resistive state, which is indicative of the logical value being stored in cell 117. If in a high resistive state, the voltage drop across cell 117 is higher than in the low resistive state.

During a memory read operation, signals RIRDN and IRDN are biased at different voltages to set nodes RGBL and GBL at different voltages. In one embodiment, RGBL is set at a voltage above GBL by a difference that is between a voltage value of the voltage drop across cell 117 in a high resistive state and a voltage value of the voltage drop across cell 117 in a low resistive state. According, with node RGBL biased above node GBL by such amount, if the voltage drop across cell 117 is at a large value due to MTJ 119 being programed at the high resistance state, then input VIN of amplifier 108 with be at a higher voltage than input VREF and sense amplifier 108 will provide a ground voltage at DO indicating that cell 117 is at a high resistance state (HRS). If the voltage drop across cell 117 is at a lower value due to MTJ 119 being programed at the low resistance state, then input VIN of amplifier 108 with be at a lower voltage than input VREF and sense amplifier 108 will provide a high voltage at DO indicating that cell 117 is at a low resistance state (LRS).

In one embodiment, node GBL is biased at a voltage in the range of 150-250 mV. Node RGBL is biased at a voltage that is dependent upon the difference in resistances of the HRS and the LRS and the amount of current (IC) flowing through path 135 during a memory read operation. In some embodiments, the median resistance of a cell in a low resistance state (LRS) is less than 9K Ohms and a median resistance of a cell in a high resistance state is two to three times the median resistance of the LRS. In one embodiment where GBL is biased at a voltage in the range of 150-250 mV, RGBL is biased at a voltage of approximately 100 mV above the bias voltage of GBL. However, the resistances and bias voltages may be of other values in other embodiments and may be based on other factors such as the characteristics of the memory cell.

In one embodiment, providing a voltage differential between nodes GBL and RGBL allows for the emulation of a voltage drop across reference cell 115 without the reference cell having to have a large resistor (e.g. 10K ohms) to provide the reference voltage drop for each sense amplifier. Accordingly, such a memory may be constructed with less resistors and with less die area.

Furthermore, utilizing large resistors for each memory cell may introduce a level of variation among the reference cells due to resistor mismatch. Accordingly, with embodiments described herein, by not utilizing large resistors in the reference cells, better read uniformity can be achieved. In addition, not utilizing large reference resistors in a reference current path may decrease the time needed for sensing due to lower RC values than with reference cells having large reference resistors. By providing a solution with no resistors in the reference cells in some embodiments, memory read times can be decreased and smaller read currents can be used.

Furthermore, providing a memory cell bias voltage that is equal to the voltage (VSRC) applied to unselected source lines may negate the need for negative well biasing or the need to apply a negative gate voltage to unselected word lines for reducing leakage current in unselected select transistors of a column. Also, because the reference voltage at sense amplifier VREF is at low impedance due to no reference resistor in the reference path, kickback noise from the sense amplifier is reduced.

Utilizing a difference between the bias voltages applied to RGBL and GBL nodes to emulate a reference resistance may allow for the emulated resistance value of a reference cell to be more easily trimmed by controlling the voltage difference between RIRDN and IRDN as opposed to having to trim the individual reference resistors for each sense amplifier.

Utilizing flipped voltage followers 123 and 124 to provide the bias voltages to the memory cell and reference cell current paths during a read operation may provide for bias voltages that are more accurate due to a controlled amount of current flowing through the flipped voltage followers and may provide for bias voltages that can be stabilized faster due to the negative feedback biasing the gates of transistors 127 and 131 of the flipped voltage followers.

Figure 2:
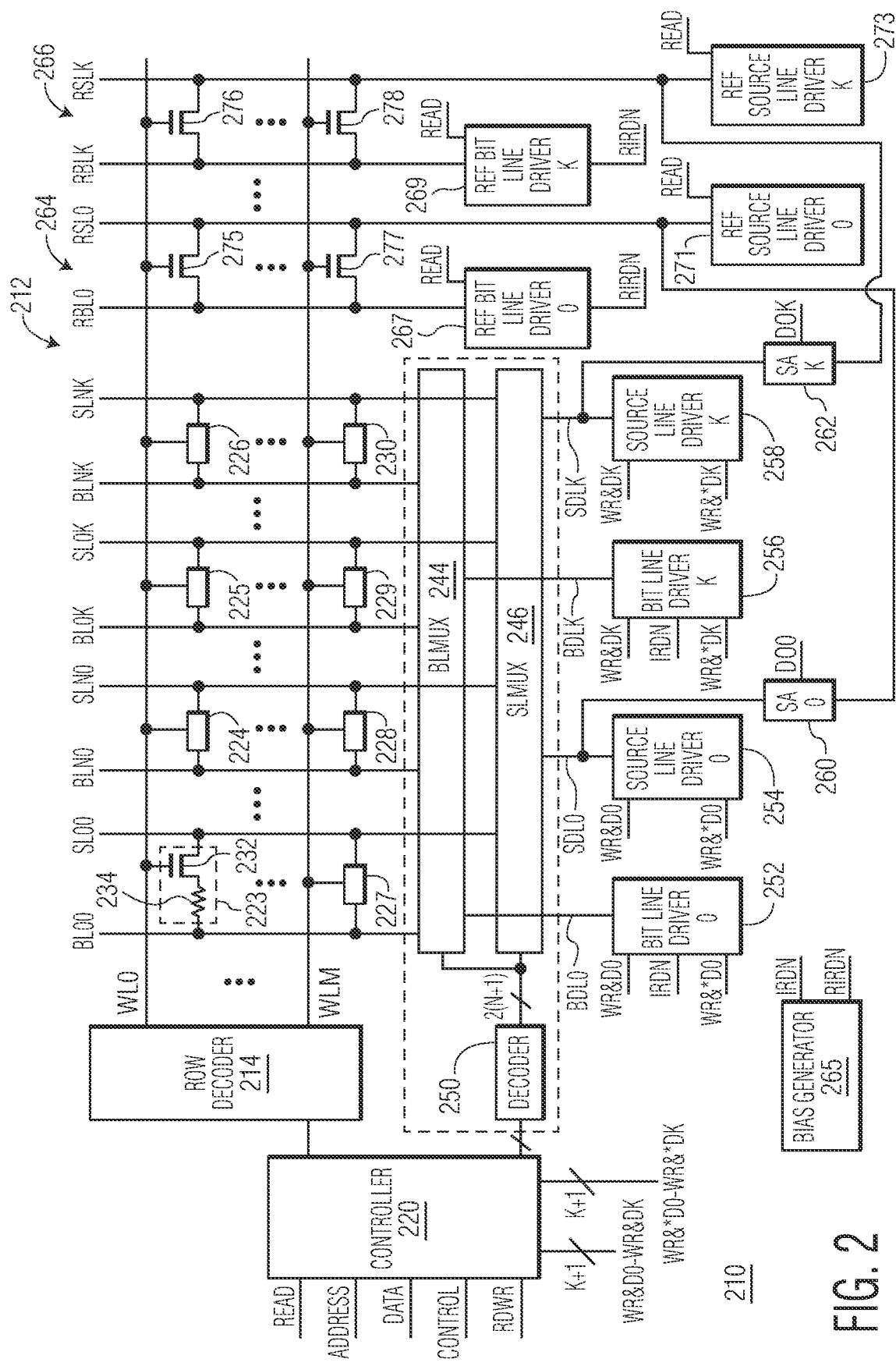
FIG. 2 is a circuit diagram of a memory according to one embodiment of the present invention.

FIG. 2 is a circuit diagram of a memory circuit 210 according to one embodiment of the present invention that implements read circuitry similar to the read circuitry shown in FIG. 1. Memory circuit 210 includes an array 212 of memory cells (e.g. 223-230). In one embodiment, the memory cells of array 212 are characterized as resistive memory cells with each cell including a select transistor (e.g. 232) and a resistive storage element (e.g. 234). Types of resistive memory cells include, for example, MRAM, ReRAM, carbon nanotube, and phase change memory cells. However, array 212 may include other types of memory cells in other embodiments. In some embodiments, the resistive storage elements may be implemented with magnetic tunnel junctions (MTJ) (e.g. 119, 234). Note that in the illustrated embodiments, the select gate transistors are NFETs. However, other types of resistive memory cells may have other configurations and/or be implemented with other types of resistive storage structures. In some embodiments, memory circuit 210 may be coupled to a processor circuit (not shown) of an electronic system that provides data to be written in the memory and receives the read data from the memory via a memory bus that include address (ADDRESS), data (DATA), and control (CONTROL) signal lines.

The memory cells of array 212 are arranged in rows and columns. Each cell of a row is coupled to a corresponding word line of WL0-WLM for controlling the select transistor (e.g. 232) of the cell to access the resistive storage element (e.g. 234) of the cell during a memory operation. The word lines are controlled by a row decoder 214 which asserts a selected one of the word lines based on a first portion of an address received by a controller 220 for the memory operation on the ADDRESS lines. Array 212 includes M+1 number of rows with 2 rows being shown in FIG. 2. However, an array may include a different number of rows in other embodiments. For example, an 8 Mb memory array may have 2048 rows plus a few (e.g., 2 or 4) redundant rows.

In the embodiment shown, the memory cells of each column of array 212 are coupled to a corresponding source line of source lines SL00-SLNK and a corresponding bit line of bit lines BL00-BLNK. Array 212 includes (N+1)(K+1)

source lines and (N+1)(K+1) bit lines, where FIG. 2 illustrates four source lines (e.g. SL00, SLN0, SL0K, and SLNK) and four bit lines (e.g. BL00, BLN0, BL0K, and BLNK). However, array 212 may have a different number of columns in other embodiments (e.g. 64*(N+1)). In other embodiments, each column of an array may include a source line paired with two bit lines, a single bit line, or different combinations of bit lines and source lines. As described herein, a "column line" may refer to either a source line or a bit line.

In the embodiment shown, memory circuit 210 includes a column decoder 216 for selecting a subset of the bit lines and source lines (BL00-BLNK, SL00-SLNK) to provide to write circuitry (included in bit line driver circuits 252 and 256 and source line driver circuits 254 and 258) during a memory write operation and to provide to sense amplifiers (260 and 262) during a memory read operation. In the embodiment shown, the column decoder 216 includes a bit line multiplexer 244 for selecting a subset of the bit lines (BL00-BLNK) and source line multiplexer 246 for selecting a subset of the source lines (SL00-SLNK) during a memory operation. The control inputs for bit line multiplexer 244 and source line multiplexer 246 are provided by decoder 250. The control signals from decoder 250 are based on a second portion of the ADDRESS received by controller 220, which provides the second address portions to decoder 250. In one embodiment, the control signals provided by decoder 250 are also based on the RDWR signal, which is asserted during a read or write operation.

The column decoder 216 selects K+1 number of selected bit lines and selected source lines from a total number of (K+1)(N+1) bit lines and source lines of array 212 based on a second portion of the ADDRESS received by controller 220 for a memory operation. In some embodiments, K+1 represents the size of the data unit (e.g. 8, 16, 32, 64 bits) being written to or read from memory array 212 during a memory operation. In other embodiments, K+1 may include multiple data units (e.g. 128 bits, 256 bits) in a row. N+1 represents the decode ratio (e.g. 4 to 1, 8 to 1, 16 to 1) of column decoder 216.

During a write operation, the selected source lines are coupled to source line driver circuits (254, 258) via mux transistors (not shown in FIG. 2) in source line multiplexer 246 and via source data lines (SDL0, SDLK). The selected bit lines are coupled to bit line driver circuits 252 and 256 via mux transistors (not shown in FIG. 2) in bit line multiplexer 244 and via bit data lines (BDL0, BDLK). In one embodiment, during a write operation to a memory cell of a column, bit line driver (e.g. 252) couples the bit line (e.g. BL00) of the column to one write voltage of either VDD or VSS and a source line driver (e.g. 254) couples the source line (e.g. SL00) of the column to the other write voltage of VDD or VSS, depending on the data value being written as determined by the write data lines (WR&D0-WR&DK) and complementary write data lines (WR&*D0-WR&*DK). During the write operation, the select transistor (e.g. 232) is made conductive by assertion of the appropriate word line to provide a voltage differential across the resistive storage element (e.g. 234) whose polarity determines whether a 1 or 0 is written to the cell.

In the embodiment shown, during a read operation, the selected source lines are provided to sense amplifiers 260 and 262 and to the source line drivers (254 and 258) via mux transistors (not shown in FIG. 2) in source line multiplexer 246 and via the source data lines (SDL0, SDLK). The selected bit lines are coupled to bit line driver circuits 252 and 256 via mux transistors (not shown in FIG. 2) in bit line multiplexer 244 and via bit data lines (BDL0, BDLK). During the read operation, the select transistor (e.g. 232) is made conductive by assertion of the appropriate word line. Each sense amplifier provides a read value from the cell to a data line (DO0-DOK).

Figure 3:
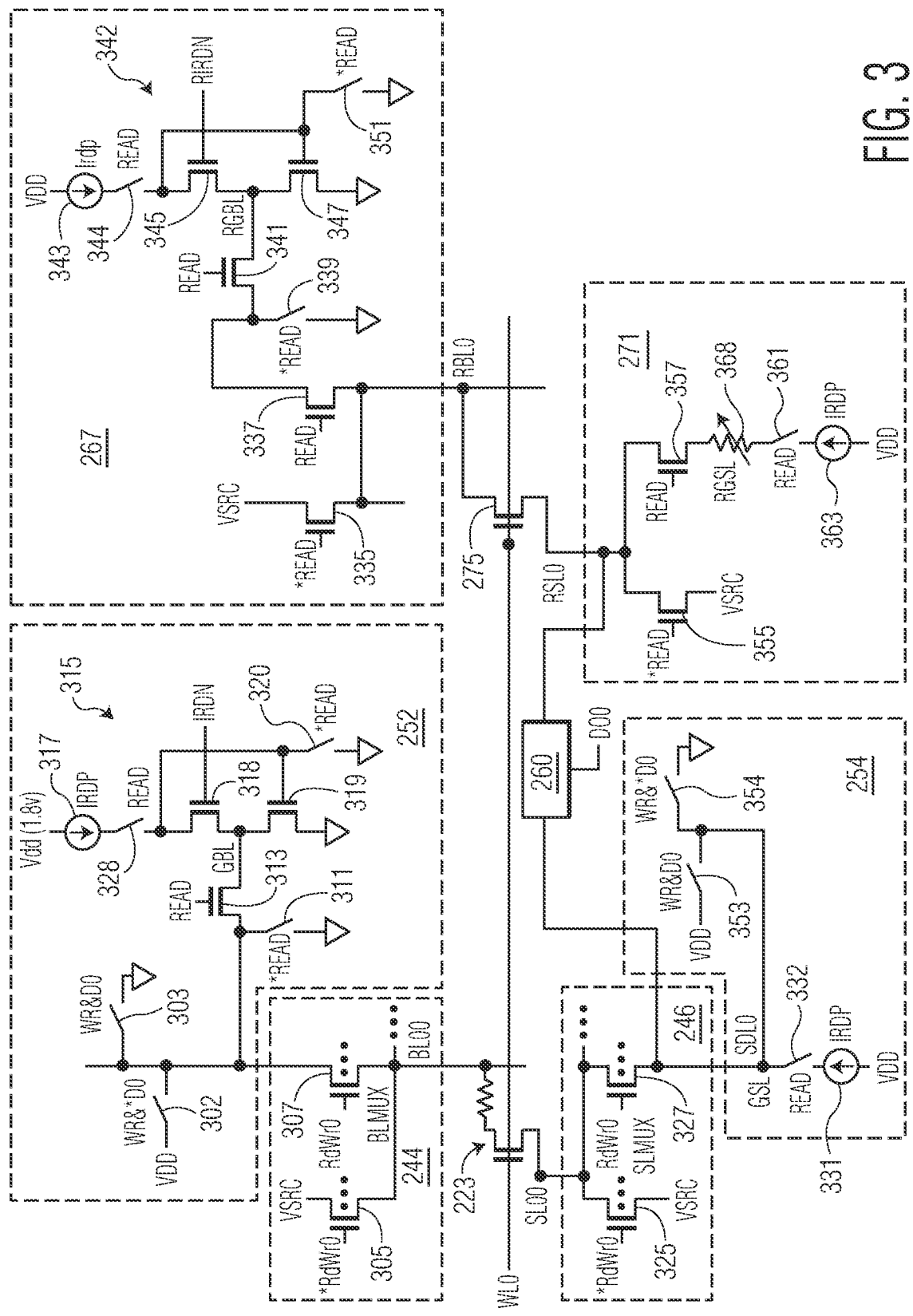
FIG. 3 is a circuit diagram of memory column line drivers according to one embodiment of the present invention.

As will be shown in FIG. 3, the bit line drivers (252, 256) each include a flipped voltage follower (similar to flipped voltage follower 124 of FIG. 1) that includes a node (GBL) for providing a bias voltage to the selected bit line. Each source line driver (254, 258) includes a mirror PFET (similar to PFET 105 of FIG. 1) for setting a bias current IC through the selected source line during a memory read operation.

Array 212 also includes reference columns 264 and 266 of reference cells (275-278) for providing a reference voltage to the sense amplifiers (260, 262) during a read operation. Each reference cell of a row is coupled to a corresponding word line WL0-WLM for controlling the select transistor of the reference cell during a memory operation. Each reference cell is coupled to a reference bit line (RBL0, RBLK) and a reference source line (RSL0, RSLK). Each reference bit line (RBL0, RBLK) is coupled to reference bit line driver (267 and 269) and each reference source line (RSL0, RSLK) is coupled to a reference source line driver. As will be shown in FIG. 3, each reference bit line driver (267 and 269) includes a flipped voltage follower similar to flipped voltage follower 123 for providing a bias voltage RGBL during a memory read operation. Each reference source line driver includes a mirror PFET (similar to PFET 104 of FIG. 1) for setting a bias current IC through the reference source line during a memory read operation.

In the embodiment of FIG. 2, array 212 includes a reference column (264, 266) for every sense amplifier (260, 262). Although FIG. 2 shows the reference columns located on one side of array 212, in other embodiments, the reference columns may be physically interspersed with the columns of the memory cells in array 212.

Memory 210 also includes a bias generator 265 for providing bias voltages IRDN and RIRDN. A memory may have other configurations in other embodiments. In some embodiments, the reference cells would be located outside of array 212.

FIG. 3 is a circuit diagram of bit line driver 252, source line driver 254, reference bit line driver 267, and reference source line driver 271 according to one embodiment of the present invention. FIG. 3 also shows a portion of bit line mux 244 and a portion of source line mux 246 associated with the column of array 212 that includes memory cell 223. In the embodiment of FIG. 3, memory cell 223 and reference cell 275 are shown for illustrating their coupling to the driver circuitry during a memory read operation.

Bit line mux 244 includes mux transistor 307 for coupling bit line BL00 to bit data line BDL0 during a memory access to a cell on bit line BL00. Mux transistor 307 is controlled by a select signal RDWR0 generated by decoder 250 during a memory access to a cell of bit line BL00. Mux transistor 305 is made conductive by *RDWR0 which is asserted when no cell on bit line BL00 is being accessed to bias bit line BL00 at voltage VSRC, which in one embodiment is in the range of 150-250 mV, but may be of other voltages (e.g. ground) in other embodiments. In one embodiment, VSRC is the same voltage as GBL. In one embodiment, decoder 250 generates decoder signals RDWR[0–N] and *RDWR[0–N] where N+1 is the number of memory cell columns per sense amplifier of memory 210. In one embodiment, mux 244 includes 2(K+1)(N+1) mux transistors.

Source line mux 246 includes mux transistor 327 for coupling source line SL00 to source data line SDL0 during a memory access to a cell on source line SL00. Mux transistor 327 is controlled by a select signal RDWR0 generated by decoder 250 during a memory access to a cell of source line SL00. Coupling transistor 325 is made conductive by *RDWR0 which is asserted when no cell on source line SL00 is being accessed and source line SL00 is being biased at voltage VSRC. In one embodiment, mux 246 includes 2(K+1)(N+1) mux transistors.

Bit line driver 252 and source line driver 254 each include write circuitry for writing a value to a cell coupled to bit data line BDL0 and source data line SDL0 (e.g. memory cell 223). In the embodiment shown, bit line driver 252 includes switch 302 which is closed to bias bit line BL00 to VDD (e.g. 1.8V in some embodiments) and source line driver 254 includes switch 354 which is closed to bias source line SL00 to ground to write a 0 value to a memory cell (cell 223) coupled to bit line BL00 and source line SL00. Switches 302 and 354 are closed by the assertion of the data write signal WR&*D0. During a write of "0", switches 303 and 353 are open in that data write signal WR&DO is non asserted during the write "0" operation. Bit line driver 252 includes switch 303 which is closed to bias bit line BL00 to ground and source line driver 254 includes switch 353 which is closed to bias source line SL00 to VDD to write a "1" value to a memory cell (cell 223) coupled to bit line BL00 and source line SL00. Switches 303 and 353 are closed by the assertion of the data write signal WR&D0. During a write "1" operation, switches 302 and 354 are open in that data write signal WR&*DO is not asserted during the write "1" operation.

When not in a read operation, the reference bit lines (RBL0) and reference source lines (RSL0) are biased at voltage VSRC by making conductive the coupling transistors (335) of the reference bit line drivers (267) and making conductive the coupling transistors (355) of the reference source line drivers (271) in response to the assertion of the *READ signal.

Drivers 252 and 254 include read circuitry for reading a memory cell that is coupled to source data line SDL0 and bit data line BDL0 during a read operation, which in the embodiment shown is cell 223. Driver 252 includes a flipped voltage follower 315 that includes transistors 318 and 319 coupled in series and is sourced by current source 317. The gate of transistor 318 is biased by bias voltage IRDN. During a memory read operation, transistor 313 is made conductive by the READ signal and switch 311 is opened by the *READ signal such that flipped voltage follower 315 provides a read bias voltage on BDL0, similar to flipped voltage follower 124 of FIG. 1. During a memory read operation, switch 328 is closed and switch 320 is opened.

Driver 254 includes current source 331 that is coupled to source data line SDL0 during a read operation by the closing of switch 332. Current source 331 provides current to a current path similar to transistor 105 of FIG. 1 during a read operation.

Reference drivers 267 and 271 include circuitry for providing a reference current path that is biased with a reference voltage on node RGBL during a read operation. Driver 267 includes flipped voltage follower 342 for providing a bias voltage on node RGBL during a read operation. Follower 342 is sourced by current source 343 during a read operation. Follower 342 includes transistor 345 that is biased by bias signal RIRDN and transistor 347 which is coupled in series with transistor 345. Switch 344 is closed and transistor 341 is made conductive by the assertion of the READ signal during a read operation. Switches 339 and 351 are opened during a read operation by the de-assertion of the *READ signal. Follower 342 performs similar operations to follower 123 of FIG. 1.

Driver 271 includes current source 363 that performs a function similar to transistor 104 of FIG. 1. Driver 271 includes a transistor 357 that is made conductive and switch 361 that is closed during a read operation. In addition, driver 271 includes a trimmable resistor 368 to allow for the individual adjustment of the resistance of each reference current path.

During a read operation, sense amplifier 260 compares the voltage of the source data line SDL0 with the voltage of the reference source line RSL0 to determine whether a logical "1" or logical "0" is stored in a memory cell (223). The column line driver circuits (252, 254, 267, and 271) may have other configurations in other embodiments.

Figure 4:
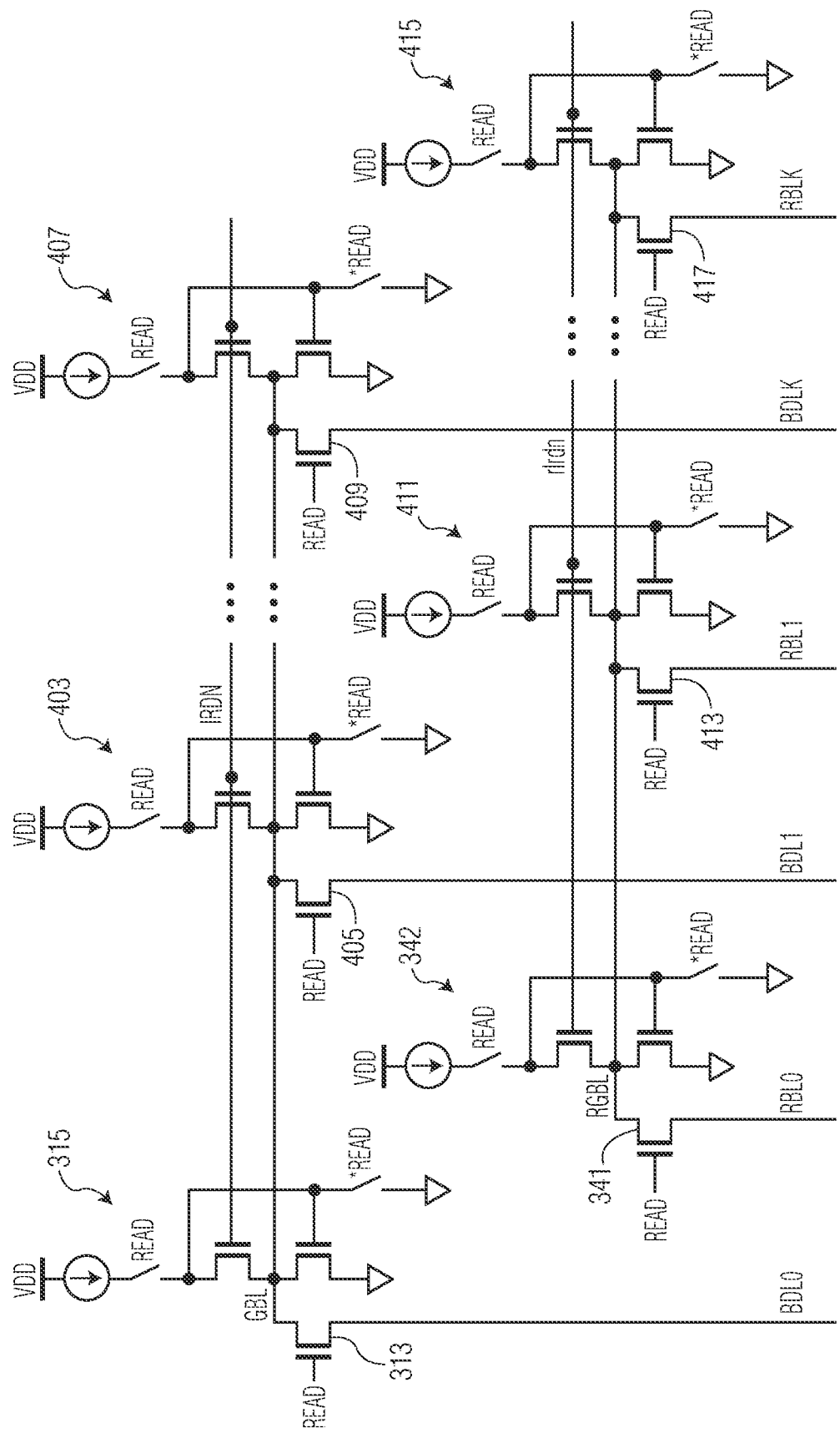
FIG. 4 is a circuit diagram of a configuration of flipped voltage followers in a memory according to one embodiment of the present invention.

FIG. 4 is a circuit diagram showing a configuration of flipped voltage followers for providing a bias voltage to the memory current paths and a configuration of flipped voltage followers for providing a bias voltage to the reference current paths according to one embodiment. Followers 315, 403, and 407 provide a bias voltage at nodes GBL of the followers to the data bit lines (BDL0, BDL1, and BDLK) through transistors 313, 405, and 409, respectively, during a memory read operation. Followers 342, 411, and 415 provide a bias voltage at nodes RGBL of the followers to the reference source lines (RBL0, RBL1, and RBLK) through transistors 341, 413, and 417, respectively, during a memory read operation. In the embodiment of FIG. 3, there is a second transistor (337) controlled by the READ signal located in between a transistor (341) and the reference bit line (RBL0).

As shown in FIG. 4, the GBL nodes of followers 315, 403, and 407 are connected together so as to minimize any variation in the voltage provided by followers 315, 403, and 407 due to device mismatch. As shown in FIG. 4, the RGBL nodes of followers 342, 411, and 415 are also connected together for minimizing voltage variation as well.

In the embodiment shown, there is a flipped voltage follower for each memory cell input (see input VIN of FIG. 1) of each sense amplifier and a flipped voltage follower for each reference input (see input VREF of FIG. 1) of each sense amplifier. However, other embodiments may include a different ratio of flipped voltage followers per sense amplifier inputs. Because the GBL nodes are connected together and the RGBL nodes are connected together, a smaller ratio of flipped voltage followers to sense amplifiers maybe utilized. For example, some embodiments may include a two flipped voltage followers (one for biasing the memory current paths and one for biasing the reference current paths) for every three sense amplifiers. In some embodiments, the ratio of flipped voltage followers to sense amplifiers may be higher than 2 to 1.

In some embodiments, connecting the flipped voltage follower nodes together may allow for smaller transistors to be used in that shorting the devices together minimizes device mismatch. If the flipped voltage follower nodes were not connected together, then more robust designs with larger devices may be needed to ensure that the voltages are at desired values. However, in other embodiments, the flipped voltage follower nodes would not be connected together.

Figure 5:
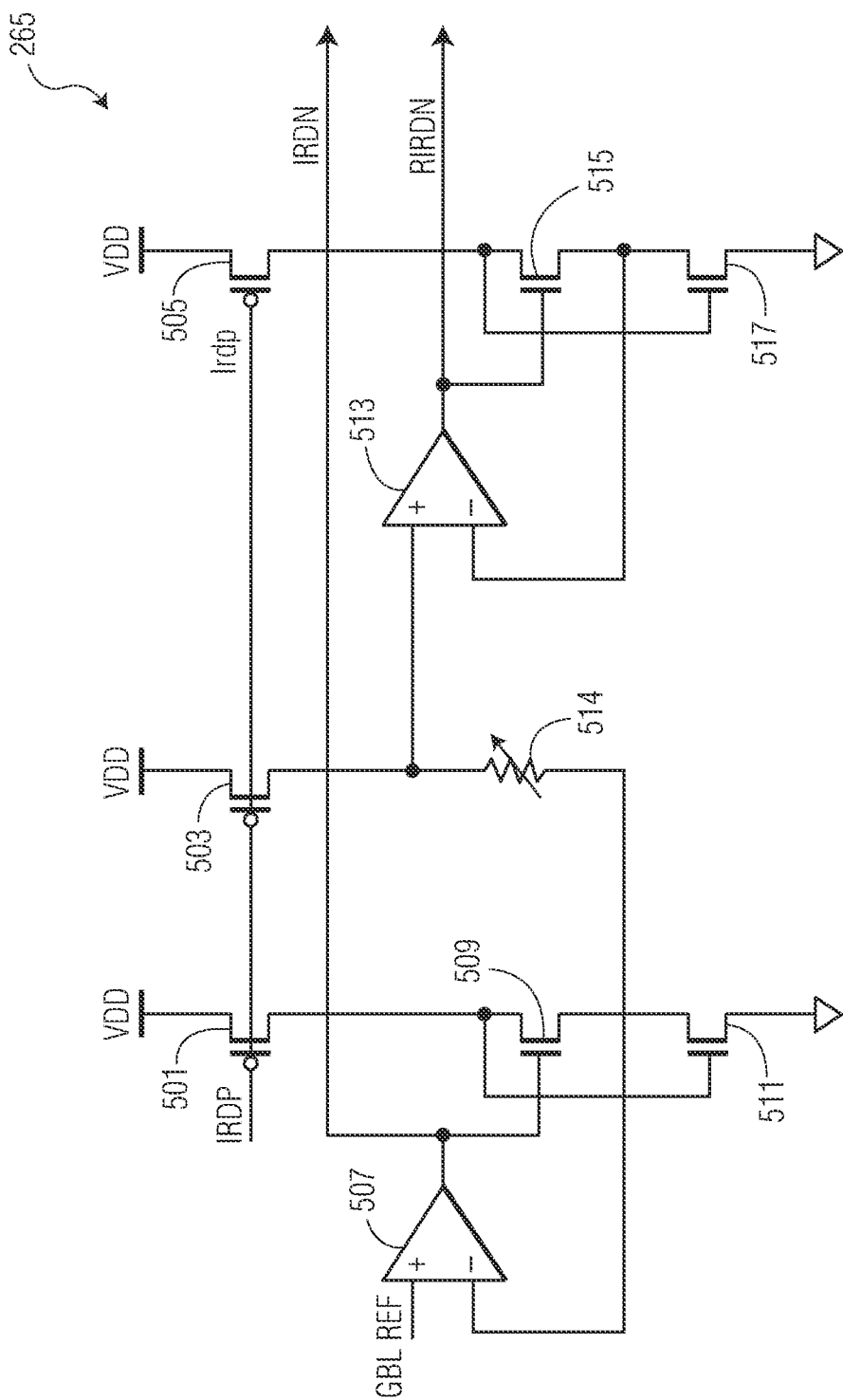
FIG. 5 is a circuit diagram of a bias regulator according to one embodiment of the present invention.

FIG. 5 is a circuit diagram of bias generator 265 according to one embodiment of the present invention. Generator 265 includes two outputs for producing the IRDN and RIRDN bias voltages. In one embodiment, PFET transistors 501, 503, and 505 act as current sources that are of the same size as transistors 103-107 and are biased by voltage IRDP (see FIG. 1) to provide the same current (IC). Generator 265 includes trimmable reference resistor 514 that is sized to provide a desired reference resistance between the high resistance state (HRS) of a memory cell and a low resistance state (LRS) of a memory cell. Current following though reference resistance 514 generates a voltage drop indicative of a desired voltage drop for a reference cell. Generator 265 includes a flipped voltage follower that includes transistors 515 and 517 coupled in series. Voltage RIRDN is generated by amplifier 513 whose output adjusts RIRDN (which biases the gate of transistor 515) such that the voltage at the node between transistors 515 and 517 matches the voltage on the high side terminal of resistance 514.

Generator 265 also includes amplifier 507 and a flipped voltage follower that includes transistors 509 and 511 coupled in series. The noninverting input of amplifier 507 receives a GBL REF voltage that is used to set the voltage of the IRDN signal. The IRDN signal also biases the gate of transistor 509. The source of transistor 509, the drain of transistor 511, the low side terminal of resistance 514, and the inverting input of amplifier 507 are connected together. Amplifier 507 adjusts the IRDN signal so that the low side terminal of resistance 514 matches the voltage of GBL REF. In one embodiment, the voltage of GBL REF is in the range of 150-250 mV, but may be of other values in other embodiments. Accordingly, the IRDN and RIRDN bias voltage signals are set so as to bias the flipped voltage followers of a memory to provide a voltage difference between nodes GBL and RGBL that matches a voltage drop across reference resistance 514. Other bias generators may have other configurations in other embodiments.

Although the embodiments described herein show the use of flipped voltage followers for both the memory cell current path and the reference cell current path of the read circuitry, other embodiments may only implement flipped voltage followers in the reference cell current paths. Also, some embodiment, may include separate read and write memory cell column lines.

As shown herein, the circuits are implemented with FETs, however other types of transistors may be used. A gate is a control electrode for a FET and the source and drain are current electrodes for a FET. In one embodiment, the switches shown and described herein (e.g. 339, 351) may be implemented by NFETS, PFETs, pass gates, or other types of transistors.

In one embodiment, a memory includes a plurality of memory cells. Each memory cell of the plurality of memory cells is for storing a value. The memory includes read circuitry for reading values stored in the plurality of memory cells. The read circuitry includes a sense amplifier including a first input, a second input, and an output for providing an indication during a memory read operation of a value stored in a memory cell based on a comparison of the first input and the second input. The read circuitry includes a first flipped voltage follower for providing a first bias voltage to a node in a first current path coupled to the first input during a memory read operation. The first current path coupled to a memory cell of the plurality of memory cells being read during a memory read operation. The read circuitry includes a second flipped voltage follower for providing a second bias voltage to a node in a second current path coupled to the second input during a memory read operation. The second bias voltage being different from the first bias voltage.

In another embodiment, a memory includes a plurality of memory cells. Each memory cell of the plurality of memory cells is for storing a value. The memory includes read circuitry for reading values stored in plurality of memory cells. The read circuitry includes a sense amplifier including a first input, a second input, and an output for providing an indication during a memory read operation of a value stored in a memory cell based on a comparison of the first input and the second input. The first input is coupled to a memory cell of the plurality of memory cells being read during the memory read operation. The read circuitry includes a flipped voltage follower for providing a bias voltage to a node of a reference current path coupled to the second input during a memory read operation. The flipped voltage follower includes a first transistor and a second transistor coupled in series. The first transistor includes a first current electrode and a second current electrode. The second transistor includes a current electrode coupled in the series to the first transistor on a first current electrode side of the first transistor, and includes a control electrode biased by node coupled to the first transistor on a second current electrode side of the first transistor during a memory read operation. The flipped voltage follower provides the bias voltage at a node between the current electrode of the second transistor and the first current electrode of the first transistor.

In one embodiment, a method of performing a memory read operation includes coupling a memory cell to be read in a first current path coupled to a first input of a sense amplifier and providing a first bias voltage to a first node in the first current path from a first flipped voltage follower. The method includes providing a second bias voltage to a second node in a second current path coupled to a second input of the sense amplifier from a second flipped voltage follower. The second bias voltage being different from the first bias voltage. The method includes providing an indication at an output of the sense amplifier that is indicative of value being stored in the memory cell based upon a difference between the first input and the second input.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
   a plurality of memory cells, each memory cell of the plurality of memory cells for storing a value;
   read circuitry for reading values stored in the plurality of memory cells, wherein the read circuitry includes:
      a sense amplifier including a first input, a second input, and an output for providing an indication during a memory read operation of a value stored in a memory cell of the plurality of memory cells based on a voltage comparison of the first input and the second input where the indication is based on a memory state dependent voltage drop across the memory cell during the memory read operation;
      a first flipped voltage follower for providing a first bias voltage to a node in a first current path coupled to the first input during a memory read operation, the first current path coupled to a memory cell of the plurality of memory cells being read during a memory read operation;
      a second flipped voltage follower for providing a second bias voltage to a node in a second current path coupled to the second input during a memory read operation, the second bias voltage being different from the first bias voltage.

2. The memory of claim 1 wherein a difference in voltage between the first bias voltage and the second bias voltage is indicative of a reference memory value.

3. The memory of claim 1 wherein a difference in voltage between the first bias voltage and the second bias voltage is between a first voltage drop value across a memory cell of the plurality of memory cells when the memory cell is storing a first memory state value during a memory read operation and a second voltage drop value across a memory cell of the plurality of memory cells indicative of the memory cell storing a second memory state value during a memory read operation, wherein the first voltage drop value is different from the second voltage drop value.

4. The memory of claim 1 wherein:
the second flipped voltage follower includes a first transistor and a second transistor coupled in series;
the first transistor includes a first current electrode and a second current electrode;
the second transistor includes a current electrode coupled in the series to the first transistor on a first current electrode side of the first transistor, and includes a control electrode biased by a node coupled to the first transistor on a second current electrode side of the first transistor during a memory read operation; and
the second flipped voltage follower provides the second bias voltage at a node between the current electrode of the second transistor and the first current electrode of the first transistor during a memory read operation.

5. The memory of claim 4 wherein the control electrode of the second transistor is grounded when a memory read operation is not being performed.

6. The memory of claim 4 wherein:
the first flipped voltage follower includes a third transistor and a fourth transistor coupled in series;
the third transistor includes a first current electrode and a second current electrode;
the fourth transistor includes a current electrode coupled in the series to the third transistor on a first current electrode side of the third transistor, and includes a control electrode biased by a node coupled to the third transistor on a second current electrode side of the third transistor during a memory read operation; and
the first flipped voltage follower provides the first bias voltage at a node between the current electrode of the fourth transistor and the first current electrode of the third transistor during a memory read operation.

7. The memory of claim 6 further comprising:
a bias regulator including a first output to provide a third bias voltage and a second output to provide a fourth bias voltage different from the third bias voltage;
wherein a control electrode of the first transistor receives the third bias voltage during a memory read operation and a control electrode of the third transistor receives the fourth bias voltage during a memory read operation;
wherein a difference between the third bias voltage and the fourth bias voltage is based on a voltage drop across a reference memory cell resistance during a memory read operation.

8. The memory of claim 4 wherein the second transistor is located in the second current path.

9. The memory of claim 1 wherein the read circuitry further includes:
a third flipped voltage follower for providing the second bias voltage at an output of the third flipped voltage follower during a memory read operation, the output of the third flipped voltage follower is connected to a node of the second flipped voltage follower that provides the second bias voltage.

10. The memory of claim 1 wherein the read circuitry further includes:
a third flipped voltage follower for providing the first bias voltage at an output of the third flipped voltage follower during a memory read operation, the output of the third flipped voltage follower is connected to a node of the first flipped voltage follower that provides the first bias voltage.

11. The memory of claim 1 wherein the read circuitry further comprising:
a plurality of sense amplifiers including the sense amplifier, each sense amplifier of the plurality of sense amplifiers including a first input, a second input, and an output for providing an indication during a memory read operation of a value stored in a memory cell based on a voltage comparison of the first input and the second input of the each sense amplifier;
a first plurality of flipped voltage followers including the first flipped voltage follower, each flipped voltage follower of the first plurality of flipped voltage followers for providing the first bias voltage to a node in a first current path coupled to the first input of a sense amplifier of the plurality of sense amplifiers during a memory read operation;
a second plurality of flipped voltage followers including the second flipped voltage follower, each flipped voltage follower of the second plurality of flipped voltage followers for providing the second bias voltage at a node in a second current path coupled to the second input of a sense amplifier of the plurality of sense amplifiers during a memory read operation.

12. The memory of claim 11 wherein each flipped voltage follower of the second plurality of flipped voltage followers includes a node for providing the second bias voltage during a memory read operation, the nodes for providing the second bias voltage of the each flipped voltage follower of the second plurality of flipped voltage followers are connected together.

13. The memory of claim 12 wherein each flipped voltage follower of the first plurality of flipped voltage followers includes a node for providing the first bias voltage, the nodes for providing the first bias voltage of the each flipped voltage follower of the first plurality of flipped voltage followers are connected together.

14. The memory of claim 1 wherein the memory cells of the plurality of memory cells are characterized as resistive memory cells.

15. The memory of claim 1 wherein a memory cell of the plurality of memory cells exhibits a first voltage drop value across the memory cell when storing a first memory state value during a memory read operation and a second voltage drop value across the memory cell when storing a second memory state value during a memory read operation, wherein the first voltage drop value is different from the second voltage drop value.

16. A memory comprising:
a plurality of memory cells, each memory cell of the plurality of memory cells for storing a value;
read circuitry for reading values stored in the plurality of memory cells, wherein the read circuitry includes:
a sense amplifier including a first input, a second input, and an output for providing an indication during a memory read operation of a value stored in a memory cell of the plurality of memory cells based on a voltage comparison of the first input and the second input where the first input is coupled to the memory cell during the memory read operation and where the indication is based on a memory state dependent voltage drop across the memory cell during the memory read operation;

a flipped voltage follower for providing a bias voltage to a node of a reference current path coupled to the second input during a memory read operation, the flipped voltage follower includes a first transistor and a second transistor coupled in series;

wherein the first transistor includes a first current electrode and a second current electrode;

wherein the second transistor includes a current electrode coupled in the series to the first transistor on a first current electrode side of the first transistor, and includes a control electrode biased by a node coupled to the first transistor on a second current electrode side of the first transistor during a memory read operation;

wherein the flipped voltage follower provides the bias voltage at a node between the current electrode of the second transistor and the first current electrode of the first transistor.

17. The memory of claim 16 wherein the second transistor is located in the reference current path.

18. The memory of claim 16 wherein the memory cells of the plurality of memory cells are characterized as resistive memory cells.

19. The memory of claim 16 wherein the read circuitry further comprises:

a second flipped voltage follower for providing the bias voltage to a node of a reference current path coupled to an input of a second sense amplifier during a memory read operation, the second flipped voltage follower includes a first transistor and a second transistor coupled in series;

wherein the first transistor of the second flipped voltage follower includes a first current electrode and a second current electrode;

wherein the second transistor of the second flipped voltage follower includes a current electrode coupled in the series to the first transistor of the second flipped voltage follower on a first current electrode side of the first transistor, and includes a control electrode biased by a node coupled to the first transistor of the second flipped voltage follower on a second current electrode side of the first transistor during a memory read operation;

wherein the second flipped voltage follower provides the bias voltage at a node between the current electrode of the second transistor of the second flipped voltage follower and the first current electrode of the first transistor of the second flipped voltage follower; and wherein the node that the second flipped voltage follower provides the bias voltage is connected to the node that the flipped voltage follower provides the bias voltage.

20. A method of performing a memory read operation comprising:

coupling a memory cell to be read in a first current path coupled to a first input of a sense amplifier and providing a first bias voltage to a first node in the first current path from a first flipped voltage follower;

providing a second bias voltage to a second node in a second current path coupled to a second input of the sense amplifier from a second flipped voltage follower, the second bias voltage being different from the first bias voltage;

providing an indication at an output of the sense amplifier that is indicative of a value being stored in the memory cell based upon a voltage difference between the first input and the second input, wherein the indication is based on a memory state dependent voltage drop across the memory cell.

21. The method of claim 20 wherein a difference in voltage between the first bias voltage and the second bias voltage is between a first voltage drop value across the memory cell when the memory cell is storing a first memory state value during a memory read operation and a second voltage drop value across the memory cell indicative of the memory cell storing a second memory state value during a memory read operation, wherein the first voltage drop value is different from the second voltage drop value.

* * * * *